(12) United States Patent
Chen et al.

(10) Patent No.: US 9,001,522 B2
(45) Date of Patent: Apr. 7, 2015

(54) PRINTED CIRCUITS WITH STAGGERED CONTACT PADS AND COMPACT COMPONENT MOUNTING ARRANGEMENTS

(71) Applicant: Apple Inc., Cupertino, CA (US)

(72) Inventors: Wyeman Chen, Fremont, CA (US); Michael Nikkhoo, San Jose, CA (US); Amir Salehi, San Jose, CA (US)

(73) Assignee: Apple Inc., Cupertino, CA (US)

( * ) Notice: Subject to any disclaimer, the term of this patent is extended or adjusted under 35 U.S.C. 154(b) by 164 days.

(21) Appl. No.: 13/674,834

(22) Filed: Nov. 12, 2012

(65) Prior Publication Data

US 2013/0122725 A1    May 16, 2013

Related U.S. Application Data (60) Provisional application No. 61/560,035, filed on Nov. 15, 2011.

(51) Int. Cl.
*H05K 7/10* (2006.01)
*H01R 12/00* (2006.01)
*H05K 1/11* (2006.01)
*H05K 13/04* (2006.01)
*H01R 12/52* (2011.01)
*H05K 3/34* (2006.01)

(52) U.S. Cl.
CPC ............ *H01R 9/095* (2013.01); *H05K 13/0465* (2013.01); *Y10T 29/49144* (2015.01); *H01R 12/526* (2013.01); *H05K 1/111* (2013.01); *H05K 3/3415* (2013.01); *H05K 2201/09427* (2013.01); *H05K 2201/09709* (2013.01); *H05K 2203/1572* (2013.01); *H05K 2203/304* (2013.01)

(58) Field of Classification Search
CPC ....... H05K 1/141; H05K 1/111; H01R 9/095; H01L 23/49838
USPC ........................................ 228/180.21, 180.22
See application file for complete search history.

(56) References Cited

U.S. PATENT DOCUMENTS

| | | | |
|---|---|---|---|
| 5,306,541 A | 4/1994 | Kasatani | |
| 5,420,758 A | 5/1995 | Liang | |
| 6,229,218 B1 * | 5/2001 | Casey et al. | 257/778 |
| 6,329,606 B1 | 12/2001 | Freyman et al. | |
| 6,407,460 B1 * | 6/2002 | Horiuchi et al. | 257/786 |
| 6,538,307 B1 | 3/2003 | Valluri et al. | |

(Continued)

*Primary Examiner* — Tuan T Dinh
*Assistant Examiner* — Steven T Sawyer
(74) *Attorney, Agent, or Firm* — Treyz Law Group; Kendall P. Woodruff; Joseph F. Guihan (57) ABSTRACT

Electronic devices may be provided with printed circuits to which integrated circuits and other electrical components may be mounted. A first printed circuit may have a first surface with an array of contact pads arranged in rows and columns. Each column of contact pads may have a series of contact pads separated by gaps. The contact pads in each column may be staggered with respect to the contact pads in adjacent columns such that each contact pad in a given column is horizontally adjacent to associated gaps in the adjacent columns. A component may be mounted to an opposing surface of the printed circuit such that it overlaps one of the gaps between the staggered contact pads. By mounting the component to portions of the first printed circuit that do not overlap the staggered contact pads, the risk of damaging the electrical component during solder reflow operations may be minimized.

16 Claims, 5 Drawing Sheets

(56) References Cited

U.S. PATENT DOCUMENTS

| | | |
|---|---|---|
| 6,603,199 B1 | 8/2003 | Poddar |
| 6,700,208 B1 | 3/2004 | Yoneda |
| 6,847,123 B2 | 1/2005 | Blackwood |
| 7,314,268 B2 | 1/2008 | Aruga |
| 7,427,218 B1 | 9/2008 | Hasim et al. |
| 8,193,639 B2 | 6/2012 | Liu et al. |
| 2001/0035301 A1* | 11/2001 | Li et al. .......... 174/261 |
| 2002/0166689 A1* | 11/2002 | Maetani .......... 174/52.4 |
| 2005/0040539 A1 | 2/2005 | Carlsgaard |
| 2010/0008054 A1* | 1/2010 | Dotson .......... 361/752 |
| 2010/0084177 A1* | 4/2010 | Kumakura .......... 174/261 |

\* cited by examiner

PRINTED CIRCUITS WITH STAGGERED CONTACT PADS AND COMPACT COMPONENT MOUNTING ARRANGEMENTS

This application claims the benefit of provisional patent application No. 61/560,035, filed Nov. 15, 2011, which is hereby incorporated by reference herein in its entirety.

BACKGROUND

This relates to electronic devices and, more particularly, to mounting components to printed circuits in electronic devices.

Electronic devices such as cellular telephones and other devices include components that are mounted on printed circuits. Solder connections are often used to mount components to a printed circuit. Solder connections are also sometimes used to connect printed circuits to each other.

Pressure and heat are often used during solder operations to form a reliable solder connection. If care is not taken, the pressure and heat involved in forming a solder connection on a printed circuit can damage components mounted to the printed circuit. Conventional printed circuits often include unutilized space devoid of components in order to avoid damaging the components during solder reflow operations. This type of arrangement reduces the component density of the printed circuit, which in turn can lead to an undesirable increase in the size of an electronic device.

It would therefore be desirable to be able to provide improved ways of mounting electronic components and other structures to printed circuits.

SUMMARY

Electronic devices may be provided with printed circuits to which integrated circuits and other electrical components may be mounted.

A first printed circuit may have a first surface with an array of contact pads arranged in rows and columns. Each column of contact pads may have a series of contact pads separated by gaps. The contact pads in each column may be staggered with respect to the contact pads in adjacent columns such that each contact pad in a given column is horizontally adjacent to associated gaps in the adjacent columns. This type of staggered array may be referred to as a two-dimensional non-rectangular lattice pattern.

One or more components may be mounted to an opposing surface of the printed circuit. The components may be mounted in component mounting regions. Each component mounting region may overlap an associated gap on the opposing surface that separates the staggered contact pads.

A second printed circuit may be mechanically and electrically coupled to the first printed circuit using solder. Solder paste may be interposed between contacts on the second printed circuit and the staggered contacts on the first printed circuit. A hot bar tool may be used to press the second printed circuit against the first printed circuit during solder reflow operations. The heat and pressure provided by the hot bar tool may convert the solder paste into solder connections.

By mounting the component to portions of the first printed circuit that do not overlap the staggered contact pads, the risk of damaging the electrical component during solder reflow operations may be minimized.

Further features of the invention, its nature and various advantages will be more apparent from the accompanying drawings and the following detailed description of the preferred embodiments.

DETAILED DESCRIPTION

Electronic devices may be provided with printed circuits to which integrated circuits and other electrical components may be mounted. For example, components may be mounted to printed circuits such as rigid printed circuit boards (e.g., fiberglass-filled epoxy boards) and flexible printed circuits (e.g., sheets of polyimide or flexible layers of other polymers). Connectors such as board-to-board connectors and other connectors with mating contacts may be used to couple printed circuits together. Conductive adhesive and direct solder connections may also be used in forming electrical connections between printed circuits. As an example, printed circuits may be soldered together using hot bar soldering techniques in which a heated tool (a hot bar) is brought into proximity of patterned solder paste on a printed circuit. As the solder paste is heated and reflows, hot bar solder joints may be formed to electrically and mechanically couple the printed circuits together.

Figure 1:
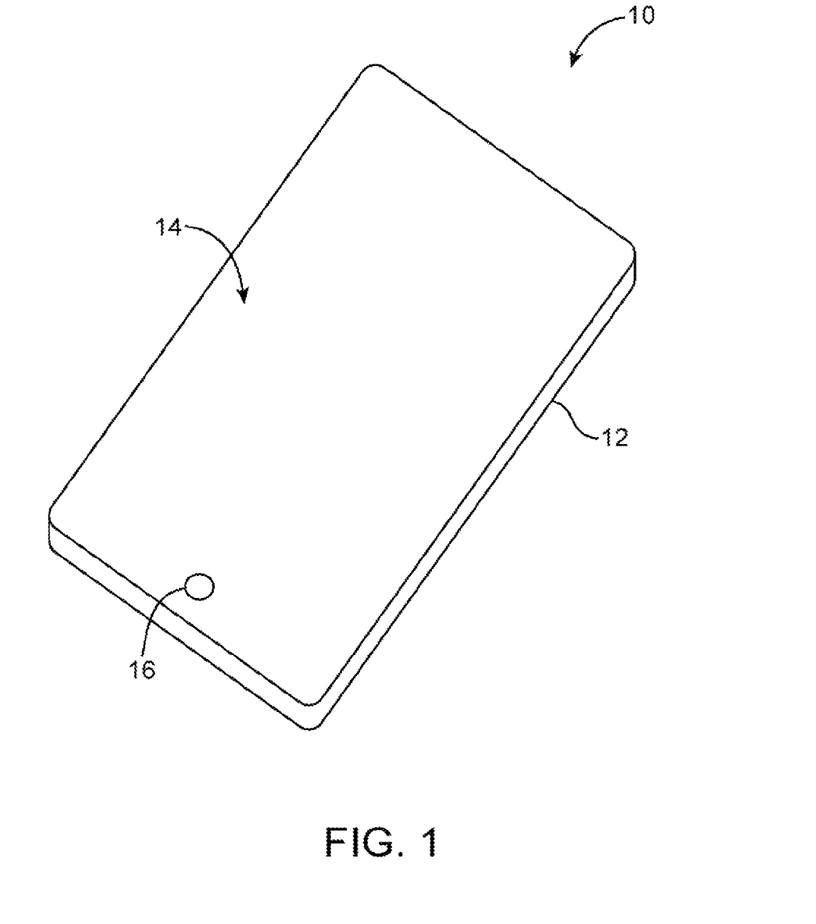
FIG. 1 is a front perspective view of an illustrative electronic device of the type that may be provided with printed circuit structures in accordance with an embodiment of the present invention.

An illustrative electronic device of the type that may be provided with printed circuits having electrical connections such as hot bar solder connections is shown in FIG. 1. Device 10 of FIG. 1 may be a handheld device such as a cellular telephone or media player, a tablet computer, a notebook computer, other portable computing equipment, a wearable or miniature device such as a wristwatch or pendant device, a television, a computer monitor, or other electronic equipment.

As shown in FIG. 1, electronic device 10 may include a display such as display 14. Display 14 may be a touch screen that incorporates a layer of conductive capacitive touch sensor electrodes or other touch sensor components or may be a display that is not touch-sensitive. Display 14 may include an array of display pixels formed from liquid crystal display (LCD) components, an array of display pixels formed from light-emitting diode (OLED) components, an array of electrophoretic display pixels, an array of electrowetting display pixels, or display pixels based on other display technologies.

Display 14 may be protected using a display cover layer such as a layer of transparent glass or clear plastic. Openings may be formed in the display cover layer. For example, an opening may be formed in the display cover layer to accommodate a button such as button 16 and, if desired an opening may be used to form a speaker port. Device configurations without openings in display 14 may also be used for device 10.

Device 10 may have a housing such as housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials.

Housing 12 may be formed using a unibody configuration in which some or all of housing 12 is machined or molded as a single structure or may be formed using multiple structures (e.g., an internal frame structure, one or more structures that form exterior housing surfaces, etc.).

Device 10 may include printed circuits to which integrated circuits and other electrical components are mounted. Solder connections may be used in attaching components to printed circuits and in attaching printed circuits to each other. For example, hot bar solder connections may be used in directly attaching printed circuits to each other without requiring a separate connector.

To form solder connections, solder paste may be printed onto contact pads on a printed circuit substrate. A surface mount tool such as a pick and place tool may be used to position components on the printed solder paste. Following placement of the components on the printed circuit substrate, solder connections may be formed by reflowing solder paste structures in a reflow oven, by heating solder paste or solder balls using a localized heat source such as a hot bar or heat gun, or using other suitable solder reflow techniques.

Figure 2:
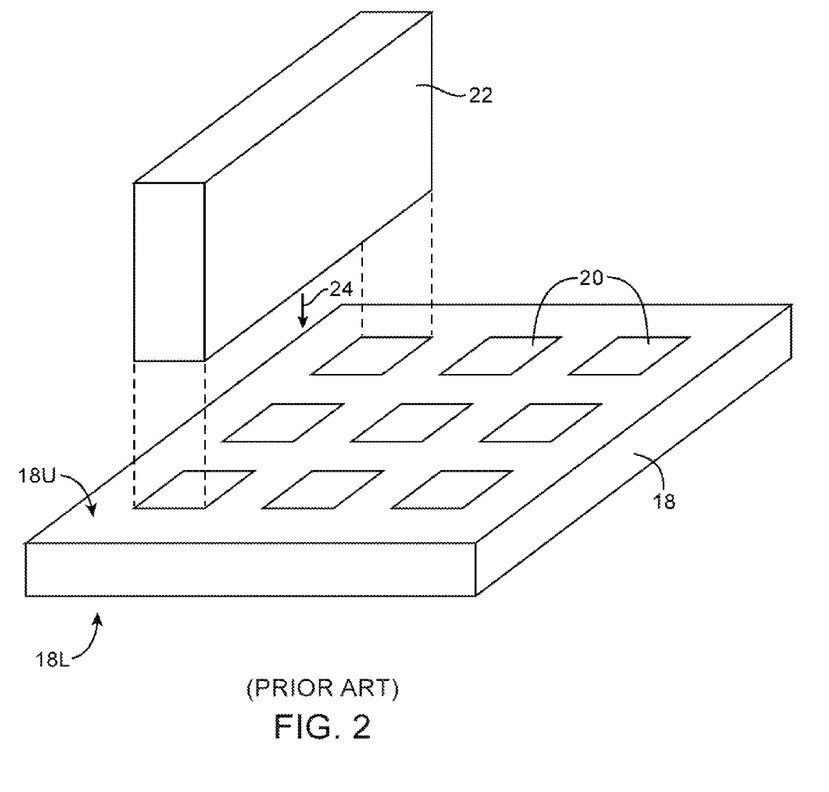
FIG. 2 is a perspective view of a conventional printed circuit having laterally aligned rows of contact pads and a surface devoid of components.

In conventional printed circuit arrangements, the heat and pressure applied during solder reflow operations prohibits components from being mounted to certain portions of the printed circuit. FIG. 2 is a perspective view of a conventional printed circuit 18 having unutilized portions that are devoid of components.

As shown in FIG. 2, printed circuit 18 includes laterally aligned rows of contact pads 20 on upper surface 18U of printed circuit substrate 18. During solder reflow operations, hot bar tool 22 is used to heat solder paste on contact pads 20 to form solder connections between contact pads 20 and electrical components. The heat and pressure that are applied to contact pads 20 in direction 24 during solder reflow operations can damage components attached to lower surface 18L of printed circuit 18. For example, a component mounted on lower surface 18L that overlaps contact pad 20 can be damaged by the heat and pressure that translates though the thickness of substrate 18 from contact pad 20 during reflow operations.

In order to avoid damaging components during solder reflow operations, lower surface 18L of substrate 18 includes unutilized portions that are devoid of components. Conventional printed circuit arrangements of the type shown in FIG. 2 may therefore suffer from reduced component density, which can in turn lead to an overall increase in the size of the electronic device in which printed circuit 18 is mounted.

Figure 3:
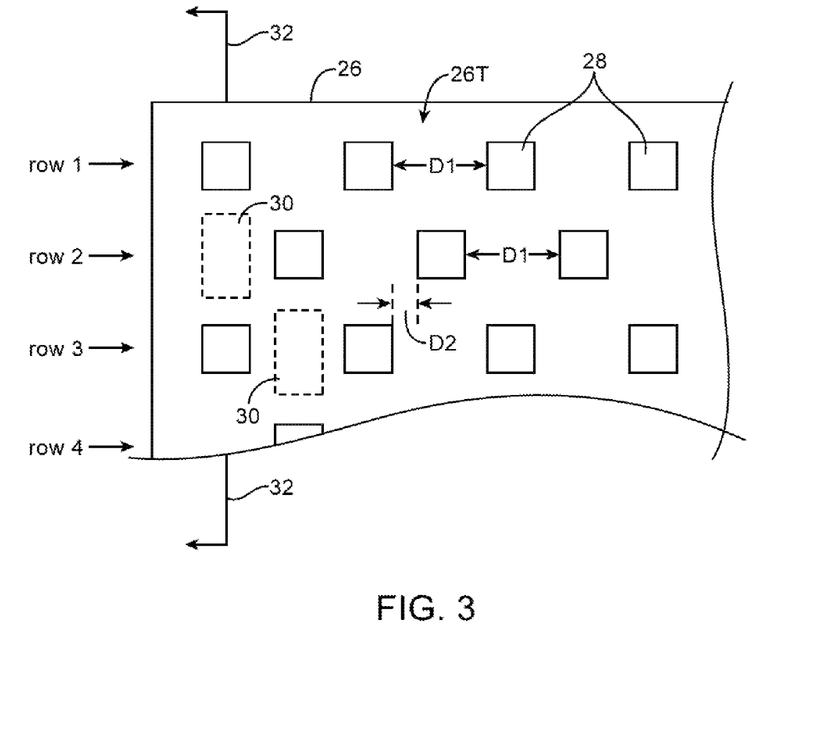
FIG. 3 is a top view of an illustrative printed circuit having an array of staggered contact pads in accordance with an embodiment of the present invention.

FIG. 3 is a top view of an illustrative printed circuit arrangement in which a printed circuit substrate such as printed circuit substrate 26 includes an efficient arrangement of contact pads such as contact pads 28. A contact pad arrangement of the type shown in FIG. 3 may maximize the amount of surface area on substrate 26 available for mounting components, thereby allowing for a more compact component mounting arrangement in device 10.

Printed circuit substrate 26 may include one or more layers of dielectric and one or more layers of conductor. Printed circuit 26 may, for example, be a flexible printed circuit formed from materials such as polyimide (sometimes referred to as a "flex circuit"), may be a rigid printed circuit board formed from a material such as fiberglass-filled epoxy (e.g., FR4), or may be formed from other suitable materials or combinations of these materials. If desired, printed circuit 26 may be a "rigid-flex" printed circuit that includes both rigid and flexible layers.

Printed circuit 26 may include one or more conductive pads such as contact pads 28 formed on top surface 26T of printed circuit 26. Although surfaces of substrates may sometimes be referred to as "top" and "bottom" surfaces or "upper" and "lower" surfaces, it should be understood that a substrate such as substrate 26 may be mounted in any suitable orientation in device 10.

Contact pads 28 may be formed from conductive material such as tin, lead, gold plated copper, or other suitable materials. Integrated circuits and other electrical components such as additional printed circuits may, if desired, be electrically and mechanically coupled to printed circuit 26 via contact pads 28.

As shown in FIG. 3, contact pads 28 may be arranged on top surface 26T of substrate 26 in a two-dimensional array of rows and columns. Contact pads 28 may, for example, be spaced a distance D1 apart from each other. For simplicity, only a portion of substrate 26 is shown in FIG. 3. If desired, there may be a greater or fewer number of contact pads 28 on substrate 26 than the number of contacts 28 shown in FIG. 3. The example of FIG. 3 is merely illustrative.

The rows and columns of contact pads 28 on surface 28T of substrate 28 may be staggered with respect to one another. For example, row 1 and row 3 of contact pads 28 may be laterally aligned with each other, whereas row 2 interposed between rows 1 and 3 may be shifted with respect to rows 1 and 3 by a distance D2. Distance D2 by which row 2 is offset from row 1 may be less than distance D1. This type of staggered array may be referred to as a two-dimensional non-rectangular lattice pattern.

The example of FIG. 3 in which contact pads 28 are spaced a distance D1 apart from each other is merely illustrative. If desired, there may be different distances between different pairs of contacts. For example, a first region of contacts may have a first bond pad pitch, and a second region of contacts may have a second bond pad pitch that is different from the first bond pad pitch (if desired). In general, any suitable distance may separate a given pair of contact pads 28.

If desired, there may be portions of substrate 26 that are do not include staggered contacts. For example, substrate 26 may include portions in which two or more rows of contacts 28 are laterally aligned with each other in a rectangular grid-like fashion and may include portions in which two or more rows of contacts are staggered in a similar fashion to that of rows 1, 2, and 3 of FIG. 3. Printed circuit 26 may include portions without contacts 28. The example of FIG. 3 in which substrate 26 includes at least three rows that are staggered with respect to each other is merely illustrative.

By staggering rows of contacts 28 on substrate 26, gaps such as gaps 30 may be created between contacts 28. The presence of gaps 30 between staggered contacts 28 may allow components to be mounted to an opposing surface of substrate 26 (e.g., a surface of substrate 26 that opposes top surface 26T). For example, by shifting row 2 of contact pads such that region 30 is free of a contact pad, region 30 may experience reduced amounts of heat and pressure during solder reflow operations. Components may therefore be mounted to an opposing surface of substrate 26 in regions that overlap gaps 30 between staggered contacts 28.

Figure 4:
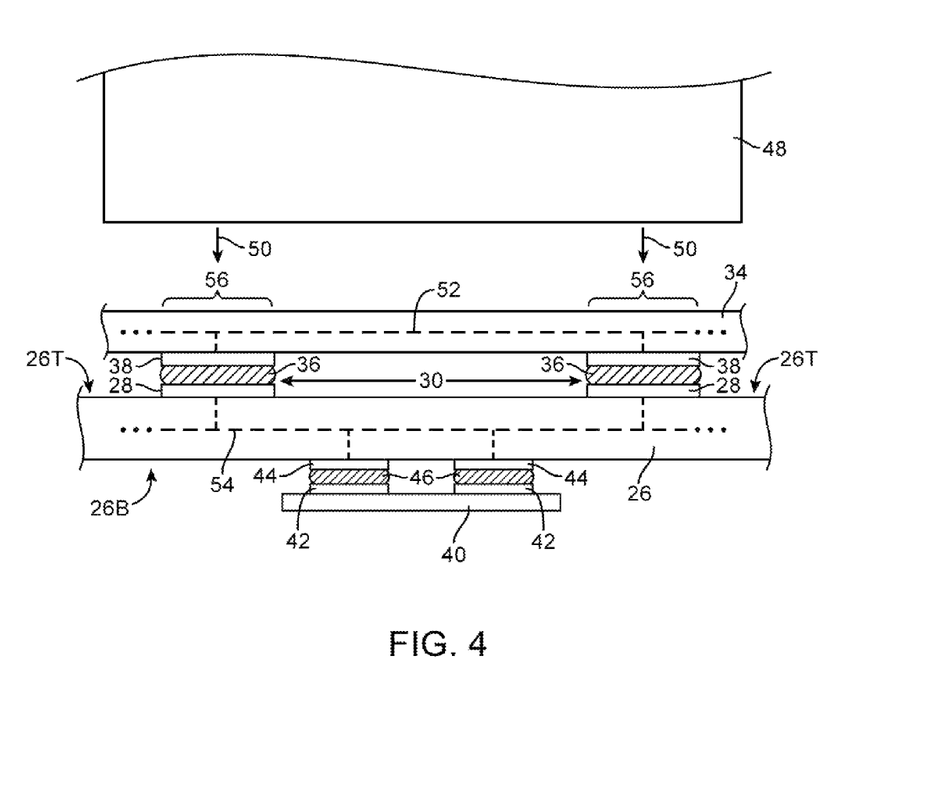
FIG. 4 is a cross-sectional side view of an illustrative printed circuit arrangement in which components and printed circuit structures are attached to a printed circuit using solder in accordance with an embodiment of the present invention.

A cross-sectional side view of printed circuit substrate 26 of FIG. 3 taken along line 32 of FIG. 3 is shown in FIG. 4. As shown in FIG. 4, a component such as component 40 may be mounted to lower surface 26B of substrate 26. Component 40 may, for example, be an integrated circuit or other electrical component. Component 40 may overlap gap 30 between staggered contact pads 28.

Components such as component 40 may be mounted to conductive pads on printed circuit 26 such as contact pads 44. Component 40 may have corresponding conductive pads such as contact pads 42 that are configured to align with contact pads 44 on substrate 26. Contact pads 42 and 44 may be formed from conductive material such as tin, lead, gold plated copper, or other suitable metals.

Prior to mounting components such as component 40 to printed circuit substrate 26, solder paste 46 may be applied to the surface of solder pads 44 on substrate 26 using a solder paste printing stencil. A pick and place tool may then be used to place component 40 on substrate 26 such that contact pads 42 on component 40 align with contact pads 44 on substrate 26. Solder connections may be formed between component 40 and solder pads 44 by reflowing solder paste structures 46 in a reflow oven, by heating solder paste or solder balls using a localized heat source such as a hot bar or heat gun, or using other suitable reflow techniques.

Other electrical components such as additional printed circuit substrates may be coupled to printed circuit substrate 26. For example, as shown in FIG. 4, an additional printed circuit such as printed circuit 34 may be coupled to printed circuit 26 using hot bar solder connections. Printed circuit 34 may, for example, be a flexible printed circuit formed from materials such as polyimide (sometimes referred to as a "flex circuit"), may be a rigid printed circuit board formed from a material such as fiberglass-filled epoxy (e.g., FR4), or may be formed from other suitable materials or combinations of these materials. If desired, printed circuit 34 may be a "rigid-flex" printed circuit that includes both rigid and flexible layers.

Printed circuits 26 and 34 may have signal paths such as vias and patterned horizontal lines that are formed from conductive materials such as metal. For example, printed circuit 34 may have solder pads 38 and other metal traces 52. Printed circuit 26 may have solder pads 28 and other metal traces 54. If desired, integrated circuits and other electrical components such as components 40 may be electrically coupled to metal traces 54 in substrate 26 and/or metal traces 52 in substrate 34. Printed circuits 26 and 34 may also be connected to additional printed circuit substrates (e.g., using solder, conductive adhesive, or connectors).

Solder 36 may be used to form an electrical connection (i.e., a solder joint) between traces 52 of substrate 34 and traces 54 of substrate 26. Initially, solder paste may be patterned onto solder pads 28 on upper surface 26T of substrate 26. Printed circuit 34 may then be placed in the position shown in FIG. 4 (e.g., using a computer-controlled positioner). With printed circuit 34 in position, a heating element such as hot bar tool 48 may be pressed down onto substrate 34 in direction 50. Hot bar 48 may apply heat and pressure to regions 56 on substrate 34 to thereby reflow the solder paste and form a solder joint 36 between contact pads 38 of substrate 34 and contact pads 28 of substrate 26.

Region 30 of substrate 26 between staggered contact pads 28 may experience reduced pressure and heat during solder reflow operations relative to regions 56. Mounting component 40 to opposing surface 26B of substrate 26 such that it overlaps gap 30 may therefore minimize the risk of damaging component 40 during solder reflow operations.

The staggered arrangement of contacts 28 on upper surface 26T of substrate 26 allows for components 40 to be mounted to lower surface 26B, thereby increasing the component capacity of printed circuit substrate 26. For simplicity, only one component 40 is shown in FIG. 4 as being mounted to lower surface 26B of substrate 26. This is merely illustrative. If desired, there may be multiple gaps 30 between staggered contacts 28, thereby allowing multiple components 40 to be mounted to portions of lower surface 26B of substrate 26 that overlap gaps 30.

Figure 5:
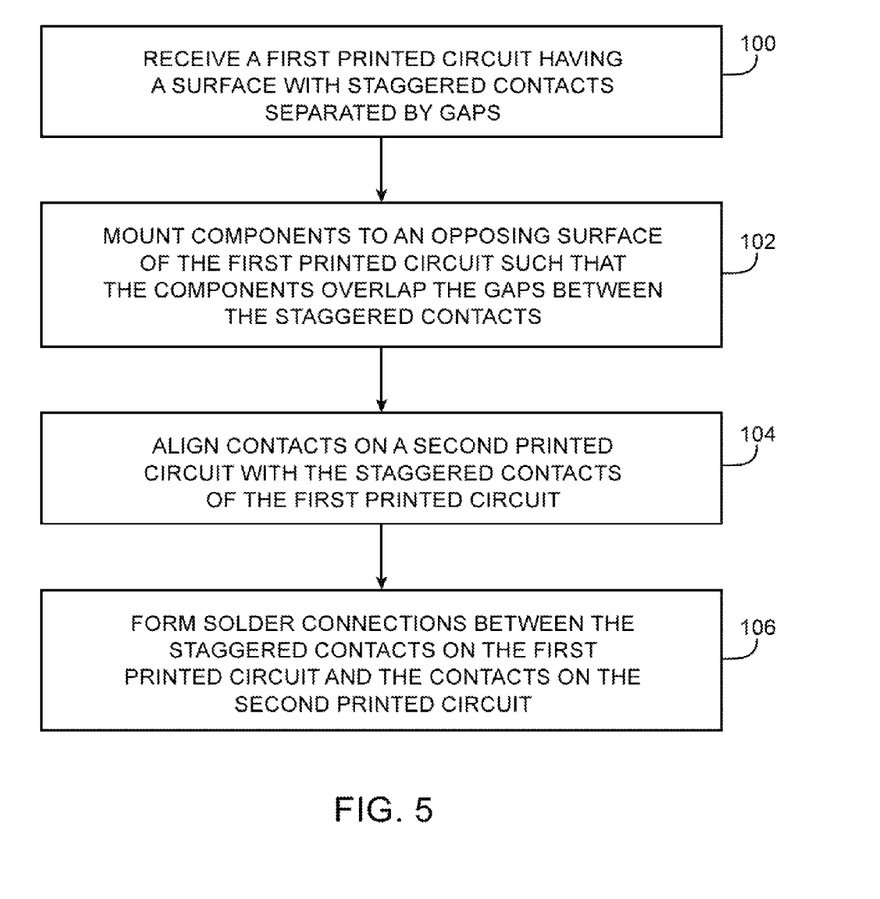
FIG. 5 is a flow chart of illustrative steps involved in mounting components and printed circuit structures to a printed circuit using solder in accordance with an embodiment of the present invention.

FIG. 5 is a flow chart of illustrative steps involved in mounting components and printed circuit structures to a printed circuit of the type shown in FIGS. 3 and 4.

At step 100, a first printed circuit such as printed circuit 26 having staggered contact pads such as staggered contact pads 28 may be received. The contact pads may, for example, be arranged in an array of rows and columns. Each row may include a series of contact pads spaced a distance D1 apart from each other (if desired). The rows may include an offset row interposed between first and second aligned rows. The aligned rows may be laterally aligned with each other. The offset row may be shifted with respect to the first and second aligned rows by a distance less than distance D1. Shifting the offset row with respect to the first and second aligned rows may provide one or more gaps between the first and second aligned rows. If desired, printed circuit substrate 26 may include multiple rows of staggered contacts and multiple gaps between the staggered contacts.

At step 102, one or more components such as component 40 of FIG. 4 may be mounted to the opposing surface of substrate 26 (e.g., the surface that opposes the surface on which contact pads 28 are located). Each component may be mounted such that it overlaps an associated gap between a pair of staggered contacts on the opposing surface of the printed circuit substrate. By aligning the components on one surface of the substrate with the gaps on the opposing surface of the substrate, the risk of damaging the components during solder reflow operations may be minimized.

At step 104, a second printed circuit such as printed circuit 34 of FIG. 4 may be positioned onto first printed circuit 26 such that the contact pads on the second printed circuit align with the staggered contact pads on the first printed circuit. Prior to positioning the second printed circuit onto the first printed circuit, solder paste such as solder paste 36 of FIG. 4 may be applied to the solder pads on the first printed circuit. If desired, a computer-controlled positioner or other positioning equipment may be used in positioning the second printed circuit onto the first printed circuit.

At step 106, solder reflow operations may be performed to form solder connections (i.e., solder joints) between the staggered contact pads on the first printed circuit and the contact pads on the second printed circuit. This may include, for example, pressing the second substrate against the first substrate with a heated element such as hot bar 48 of FIG. 4. The heat and pressure provided by the hot bar tool may reflow the solder between the first and second substrates and may thereby mechanically and electrically couple the second substrate to the first substrate.

If desired, other techniques may be used to reflow solder between the first and second substrates (e.g., conveying the substrates into a reflow oven, using other types of localized heat sources such as a heat gun, using other suitable reflow techniques, etc.). The use of a hot bar tool to form solder connections during step 106 is merely illustrative.

Areas of the first substrate that are free of contact pads may experience reduced heat and pressure during solder reflow operations relative to areas with contact pads. The risk of damaging components mounted to the first substrate may therefore be minimized because the components do not overlap contact pads to which heat and pressure is applied during solder reflow operations.

The foregoing is merely illustrative of the principles of this invention and various modifications can be made by those skilled in the art without departing from the scope and spirit of the invention. The foregoing embodiments may be implemented individually or in any combination.

What is claimed is:

1. Apparatus, comprising:
a printed circuit having first and second opposing surfaces, wherein the first surface includes a plurality of contact pads arranged in a two-dimensional array having rows and columns, wherein each column of contact pads contains a plurality of contact pads separated by respective gaps, and wherein the contact pads in each column are staggered with respect to the contact pads in adjacent columns;
at least one electrical component mounted to the second surface, wherein the at least one electrical component overlaps one of the gaps and does not directly overlap any of the contact pads;
an additional printed circuit; and
solder connections between the additional printed circuit and at least one contact pad in the plurality of contact pads, wherein the additional printed circuit comprises a flexible printed circuit.

2. The apparatus defined in claim 1 wherein the contact pads in each column are staggered with respect to the contact pads in adjacent columns such that each contact pad in a given column is horizontally adjacent to associated gaps in the adjacent columns.

3. The apparatus defined in claim 1 wherein the solder connections comprise hot bar solder connections.

4. The apparatus defined in claim 1 wherein the electrical component is mounted to the second surface using solder.

5. The apparatus defined in claim 1 wherein the printed circuit comprises a flexible printed circuit.

6. A method, comprising:
receiving a first printed circuit having a surface with a plurality of contact pads, wherein the surface includes a plurality of contact pads arranged in a two-dimensional array having rows and columns, wherein each column of contact pads contains a plurality of contact pads separated by respective gaps, and wherein the contact pads in each column are staggered with respect to the contact pads in adjacent columns;
mounting at least one component to a region on an opposing surface of the first printed circuit, wherein the region overlaps a respective one of the gaps and does not directly overlap any of the contact pads; and
applying heat and pressure to a second printed circuit to form solder connections between contact pads on the second printed circuit and the contact pads on the first printed circuit, wherein the second printed circuit comprises a flexible printed circuit.

7. The method defined in claim 6 further comprising:
aligning the contact pads on the second printed circuit with the contact pads on the first printed circuit prior to applying the heat and pressure.

8. The method defined in claim 6 wherein applying the heat and pressure to the second printed circuit comprises pressing the second printed circuit against the first printed circuit with a hot bar to form hot bar solder connections.

9. The method defined in claim 6 wherein mounting the at least one component to the opposing surface comprises forming a solder connection between the at least one component and the first printed circuit.

10. Apparatus, comprising:
a printed circuit substrate having first and second opposing surfaces, wherein the first surface comprises a plurality of staggered contact pads separated by gaps, wherein the plurality of staggered contact pads is arranged in a two-dimensional non-rectangular lattice, wherein the plurality of staggered contact pads comprises first, second, and third rows of contact pads, wherein each row has at least two contact pads separated from each other by a first distance, wherein first and third rows are laterally aligned with each other, and wherein the second row is interposed between the first and third rows and is offset from each of the first and third rows by a distance less than the first distance;
a component mounted to the second surface, wherein the component overlaps only a respective one of the gaps; and
an external circuit electrically coupled to first and second contact pads in the plurality of staggered contact pads via hot bar solder connections.

11. The apparatus defined in claim 10 wherein the respective one of the gaps is interposed between the first and second contact pads.

12. The apparatus defined in claim 10 wherein the external circuit comprises a flexible printed circuit substrate.

13. The apparatus defined in claim 10 wherein the printed circuit substrate comprises a flexible printed circuit substrate.

14. The apparatus defined in claim 10 wherein the printed circuit substrate comprises a rigid printed circuit substrate.

15. The apparatus defined in claim 10 wherein the component comprises an integrated circuit.

16. The apparatus defined in claim 10 further comprising solder connections configured to mechanically and electrically couple the component to the second surface of the printed circuit substrate.

* * * * *